(12) United States Patent
Meisner (10) Patent No.: US 7,427,201 B2
(45) Date of Patent: Sep. 23, 2008

(54) RESONANT FREQUENCY FILTERED ARRAYS FOR DISCRETE ADDRESSING OF A MATRIX

(75) Inventor: Milton D. Meisner, Draper, UT (US)

(73) Assignee: Green Cloak LLC, Beaverton, OR (US)

( * ) Notice: Subject to any disclaimer, the term of this patent is extended or adjusted under 35 U.S.C. 154(b) by 217 days.

(21) Appl. No.: 11/330,458

(22) Filed: Jan. 12, 2006

(65) Prior Publication Data

US 2007/0161263 A1   Jul. 12, 2007

(51) Int. Cl.
    H02B 1/056   (2006.01)
(52) U.S. Cl. .................... 439/48; 439/950; 349/139
(58) Field of Classification Search ................ 439/48, 439/49, 67, 950; 349/128, 129, 139
    See application file for complete search history.

(56) References Cited

U.S. PATENT DOCUMENTS

| | | |
|---|---|---|
| 5,410,371 A | 4/1995 | Lambert |
| 5,473,338 A | 12/1995 | Prince et al. |
| 5,596,344 A | 1/1997 | Kuwata et al. |
| 5,610,667 A | 3/1997 | Hush |
| 5,635,988 A | 6/1997 | Hush |
| 5,638,085 A | 6/1997 | Hush et al. |
| 5,644,340 A | 7/1997 | Harney |
| 5,682,177 A | 10/1997 | Kuwata |
| 5,745,093 A | 4/1998 | Tsuzuki et al. |
| 5,844,535 A | 12/1998 | Itoh et al. |
| 5,861,869 A | 1/1999 | Scheffer et al. |
| 5,892,425 A | 4/1999 | Kuhn et al. |
| 5,949,841 A | 9/1999 | Park |
| 5,977,961 A | 11/1999 | Rindal |
| 6,014,124 A | 1/2000 | Dickinson et al. |
| 6,028,977 A | 2/2000 | Newsome |
| 6,055,022 A | 4/2000 | Hush |
| 6,057,814 A | 5/2000 | Kalt |
| 6,130,420 A | 10/2000 | Tanaka et al. |
| 6,249,332 B1 | 6/2001 | Bryan-Brown et al. |
| 6,317,108 B1 | 11/2001 | Kalt |
| 6,456,281 B1 | 9/2002 | Rindal |
| 6,456,348 B2 | 9/2002 | Bryan-Brown et al. |
| 6,524,113 B1 * | 2/2003 | Oka .................... 439/48 |
| 6,714,273 B2 | 3/2004 | Bryan-Brown et al. |
| 6,771,237 B1 | 8/2004 | Kalt |
| 7,102,605 B2 | 9/2006 | Stumbo et al. |
| 2002/0158814 A1 | 10/2002 | Bright et al. |

FOREIGN PATENT DOCUMENTS

| | | |
|---|---|---|
| EP | 1640960 | 3/2006 |
| JP | 2006099070 | 4/2006 |

* cited by examiner

Primary Examiner—Khiem Nguyen
(74) Attorney, Agent, or Firm—Workman Nydegger

(57) ABSTRACT

Resonant frequency filtered arrays for discrete addressing of a matrix. Applications include, for example, but are not limited to, flat panel displays, transparent displays, charge-couple devices, electronic paper, printing, heated pixel arrays, chemical catalysis, accelerated polymerization, sensors, rapid prototyping, manufacturing, digital cameras, telescopes, image recording, microscopy, memory chips, selective high density radio signal routing, touch screens, index tables, robotic tactile sensors, acoustical mapping, radio frequency identification, sound filtering, audio recording, amplification, sound wave direction sensors, sound source identification, motion detection, and integrated circuits. The matrix can include a substrate and intersecting frequency filtered arrays of electrical conducting traces. Each of the electrically conducting traces is associated with a frequency of alternating current. A material is located between intersections between the frequency filtered arrays. The material changes a property in response to a stimulus received from the arrays or a source other than the arrays.

18 Claims, 6 Drawing Sheets

RESONANT FREQUENCY FILTERED ARRAYS FOR DISCRETE ADDRESSING OF A MATRIX

BACKGROUND

Dense circuit matrices typically contain row and column addressed integrated circuits. Addressing locations on dense circuit matrices are applicable to many different devices. For example, dense circuit matrices are often implemented in flat panel displays, charge-coupled devices (CCDs) such as digital cameras, deep space imagery from telescopes, microscopy, memory chips, electronic paper, heated pixel arrays, selective high density radio signal routing, and for selective curing of heat- or electro-sensitive materials. These integrated circuits, as well as many others, typically include trace connections for each coordinate, which, even at moderate complexity levels, require multiple layers of circuitry patterns to ensure isolation of each signal. As such, multiple layers requiring mechanical connections have an increased complexity and incidence of continuity errors.

Accordingly, current technology has been limited in many respects. For example, resolution, size, and profile of array-dependent constructs are limited because of the large amount of components that are required for addressing a location on the dense circuit matrix. A result of these limitations is increased circuit tracing complexity. Moreover, the manufacture of these constructs with moderate to high circuit tracing complexity levels is time-consuming and requires complicated mechanical work and expensive manufacturing equipment.

Thus, it would be advantageous to have improved methods for simplifying circuit architectures previously heavily dependent on transistors and multiple layers of complex circuitry while reducing the incidence of continuity errors.

BRIEF SUMMARY OF EXAMPLE EMBODIMENTS

Embodiments disclosed herein relate to resonant frequency filtered arrays. An apparatus is disclosed including a first electrically conductive trace configured to conduct an alternating current, the first electrically conductive trace having a first associated characteristic resonant frequency. The apparatus further includes a second electrically conductive trace configured to conduct an alternating current, the second electrically conductive trace having a second associated characteristic resonant frequency, the second electrically conductive trace intersecting the first electrically conductive trace at a first intersection. The apparatus further includes a material located at the first intersection, the material having a property that changes in response to a stimulus.

A matrix of intersecting frequency filtered arrays is disclosed. The matrix includes a first array of first electrically conductive traces configured to conduct an alternating current, each of the first electrically conductive traces having a different associated characteristic resonant frequency. The matrix further includes a second array of second electrically conductive traces configured to conduct an alternating current, each of the second electrically conductive traces having a different associated characteristic resonant frequency, wherein intersections of the first electrically conductive traces and the second electrically conductive traces define a two-dimensional grid. The matrix further includes a material located between at least a portion of the first array and the second array, the material having a property that changes in response to a stimulus.

A method for manufacturing a matrix of intersecting resonant frequency filtered arrays are disclosed. The method can include producing a first electrically conductive trace on a substrate, the first electrically conductive trace being configured to conduct an alternating current and having a first associated characteristic resonant frequency. The method can further include applying a material over at least a portion of the first electrically conductive trace, the material having a property that changes in response to a stimulus. The method can further include producing a second electrically conductive trace over at least a portion of the material, the second electrically conductive trace being configured to conduct an alternating current and having a second associated characteristic resonant frequency. These and other features of the present invention will become more fully apparent from the following description and appended claims, or may be learned by the practice of the invention as set forth hereinafter.

BRIEF DESCRIPTION OF THE DRAWINGS

To further clarify the above features of the present invention, a more particular description of the invention will be rendered by reference to specific embodiments thereof which are illustrated in the appended drawings. It is appreciated that these drawings depict only typical embodiments of the invention and are therefore not to be considered limiting of the scope of the invention. The invention will be described and explained with additional specificity and detail through the use of the accompanying drawings in which:

FIG. 1C illustrates a RF-Matrix according to an example embodiment;

FIG. 2C illustrates a RF-Matrix according to an example embodiment;

FIGS. 3A and 3B illustrate an example of a method for manufacturing a RF-Matrix;

DETAILED DESCRIPTION OF EXAMPLE EMBODIMENTS

The principles of the embodiments set forth herein describe the structure and operation of several examples used to illustrate the present invention. It should be understood that the drawings are diagrammatic and schematic representations of such example embodiments and, accordingly, are not limiting of the scope of the present invention, nor are the drawings necessarily drawn to scale. Well known devices and processes have been excluded so as not to obscure the discussion in details that would be known to one of ordinary skill in the art.

Embodiments, such as those illustrated herein, can greatly simplify and reduce the number of discrete traces required for addressing rows and columns in a matrix. This can result in greatly enhanced performance across a broad range of applications, such as those introduced above, as well as others. Applying the teachings set forth below to various embodiments can have large scale implications for simplification of manufacturing across a broad range of industries and products.

The embodiments discussed herein affix multiple circuit elements, for example, by either mounted or integrated architectures of stepped capacitive values or stepped inductive values into parallel or series circuit arrays. In this manner, each trace can have its own discrete associated inductive and/or capacitive value and associated characteristic resonant frequency corresponding thereto. These architectures allow for resonant frequency filtering utilized through Cartesian intersection.

1. Example Two-Dimensional RF-Matrix Embodiments

Figure 1A:
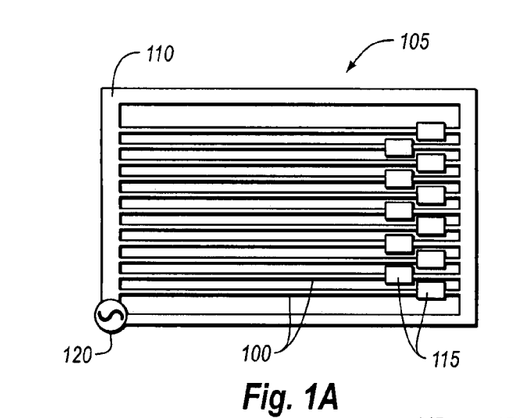
FIGS. 1A, 1B, and 1C illustrate an example of a method for manufacturing a resonant frequency matrix ("RF-Matrix")
Figure 1B:
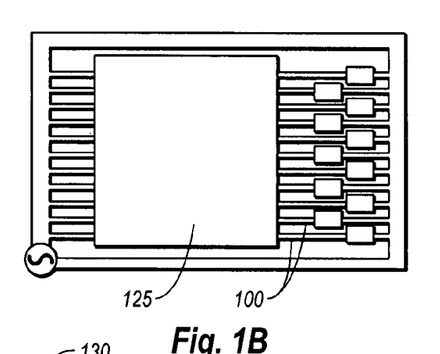
Figure 1C:
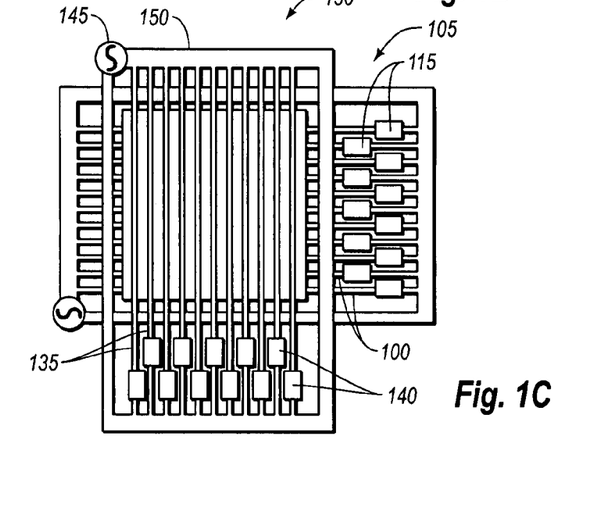

Referring to FIGS. 1A, 1B, and 1C a method for manufacturing a RF-Matrix is illustrated. Referring to FIG. 1A, an X-axis trace array 100 is produced on a non-conductive substrate 105. X-axis and Y-axis coordinates are used for illustrative purposes only and is not to be considered limiting to the scope of the present invention. The non-conductive substrate 105 supports the circuit components and can be at least partially made of materials such as glass, plastic, and/or ceramic.

A first signal bus 110 is produced on the substrate 105. The first signal bus 110 is configured to conduct alternating current of a wide range of frequencies to (or from) the X-axis trace array 100 as illustrated in FIG. 1A. Each of the traces 100 is electrically coupled to a frequency selective filter 115. The filters 115 can include, for example, capacitors and/or inductors that are configured to filter electrical signals of different frequencies. Each of the subsequent filters 115 in the array 100 can be configured to conduct an alternating current transmitted at a gradually higher (or lower) frequency.

An X-axis controller 120 is electrically coupled to the bus 110. In reactive embodiments the X-axis controller 120 is configured to generate alternating current signals at different frequencies to the filters 115 via the bus 110. In active embodiments, the X-axis controller 120 is configured to receive stimulus from the X-axis array 100 via the bus 110. It should be appreciated that the controller 120 can be located on the same substrate 105 as the resulting RF-Matrix or a separate substrate than the RF-Matrix with electrical connections for providing the alternating current to the bus 110 according to any of the embodiments discussed herein.

Referring to FIG. 1B, a material 125 is produced over the X-axis trace array 100. The material 125 can be a sheet of material that changes a property of the material in response to a stimulus. For example, in a reactive embodiment, the material changes a property of the material when a stimulus is received from the matrix. The stimulus can be a current conducted by traces located both above and below the material 125.

The material 125 may also be applied at discrete points as in a patterned sequence of the material. For example, the material may be applied at discrete points (or "islands" of material) as in a patterned sequence using various materials with different properties, such as color or density printed upon a carrier film. The material 125 applied at discrete points or manufactured in a sheet may be a combination of materials having different properties that change in response to a stimulus, or the combination of materials can be different materials that react to different stimulus. For example, each island deposit of material can correspond to a pixel of a certain property value.

The material 125 can be a reactive material that reacts to a stimulus caused by conduction of current, or heat generated by conduction of the current in the traces, and changes a property of the material 125 as a result. The property of the material 125 can be, for example, a chemical property, spectral property, electric property, piezoelectric property, mechanical property, optical property, biological property, heat activated color, elasticity of the material, a catalysis of the material for creating an object, a luminescence of the material for displaying an image, a cohesion of the material for creating an object, an expansion of the material for controlling an optic, a change in temperature of the material for changing the absorption of energy by the material, a polymerization of the material for printing an image, or wherein the property of the material responds to light as part of a charged coupled device, as well as other material properties. According to one example embodiment, the material 125 is an electro-luminescent material, which responds to an alternating current signal where X and Y traces cross with resonant gains by changing an optical property and inducing photon emission from a change in electronic energy states thereby producing luminance. According to another example, a mechanical property, such as the rigidity or cohesion of the material, can change in response to the alternating current.

Referring to FIG. 1C, a RF-Matrix 130 is illustrated according to an example embodiment. The RF-Matrix 130 is a result of the processes illustrated in FIGS. 1A and 1B along with the production of a Y-axis trace array 135 as shown in FIG. 1C. The Y-axis trace array 135 is produced over at least a portion of the sheet (or islands) of material 125 and the X-axis trace array 100. Similar to the X-axis trace array 100 illustrated in FIG. 1A, the Y-axis traces 135 are electrically coupled to a plurality of Y-axis resonant frequency filters 140. The Y-axis filters 140 selectively conduct alternating current to (or from) the Y-axis traces 135 based on the frequency of the alternating current.

A Y-axis controller 145 is electrically coupled to a bus 150 that is electrically coupled to the Y-axis filters 140. According to reactive embodiments, the Y-axis controller 145 is configured to generate alternating current signals to each of the Y-axis filters 140 via the bus 150. According to active embodiments, the Y-axis controller 145 is configured to receive signals from the Y-axis trace array 135 via the bus 150. It should be appreciated that the Y-axis controller 145 can be located on the same substrate 105 as the resultant RF-Matrix 130 or on a separate substrate than the RF-Matrix 130 according to any of the embodiments discussed herein.

The Y-axis trace array 135 can be produced such that its traces are produced substantially perpendicular to the X-axis trace array 100. However, it will be appreciated that the X-axis trace array 100 and Y-axis trace array 135 can be configured to intersect at any angle, so long as at least one trace from the X-axis array and at least one trace from the Y-axis array overlap. According to the embodiment shown in FIG. 1C, each of the Y-axis traces 135 directly overlay each of the X-axis traces 100 at a particular intersection.

In reactive embodiments, each location of intersection of the X-axis trace array 100 and the Y-axis trace array 135 can be addressed by supplying a stimulating current of a selected frequency from the X-axis controller 120 to pass through the corresponding X-axis filter 115 coupled to a particular a X-axis trace 100, and also supplying a stimulating current of a selected frequency from the Y-axis controller 145 to pass through the corresponding Y-axis filter 140 coupled to a particular one of the Y-axis traces 135. Thus a reaction of the material's 125 property can be induced at any point of intersection of the X-axis trace array 100 with the Y-axis trace array 135 by transmitting stimulating signals of an appropriate frequency to the X- and Y-axis busses 110 and 150 associated with the intersecting traces.

According to active embodiments, the RF-Matrix can also be used as a sensing apparatus when the material 125 includes an active material, rather than reactive material, sandwiched between the X- and Y-axis trace arrays 100 and 135. A reactive material is any material that responds to matrix stimulation. However, an active material is any material that stimulates the matrix in response to a stimulus originating from a source other than the matrix. It should be apparent to one of ordinary skill that the active material may still be considered reactive, but in active embodiments described herein the matrix can also be used as a sensor for environmental stimuli. Thus, in active embodiments the active material changes a property in response to a stimulus originating from a source other than the matrix, and the induced change in a property of material 125 stimulates the matrix. The stimulation of the matrix is received (i.e. sensed) by the controllers 120 and 145. In active embodiments, the X-axis controller 120 in FIGS. 1A, 1B, and 1C receives the stimulus from the X-axis array, and the Y-axis controller 145 in FIG. 1C receives the stimulus from the Y-axis array. The stimulus applied to the material can be an electric, magnetic, mechanical, chemical, biological, optical, electromagnetic, particle displacement, acoustic, and/or thermal stimulus.

Figure 2A:
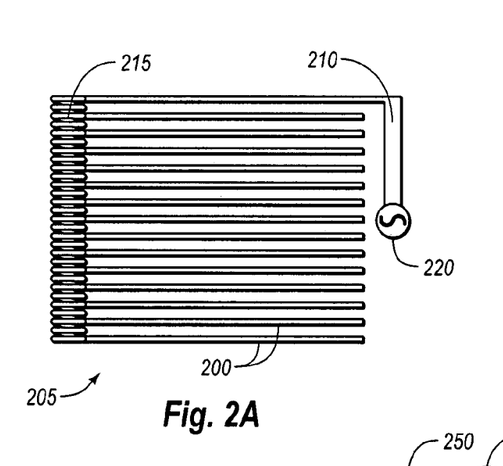
FIGS. 2A, 2B, and 2C illustrate an example of a method for manufacturing a RF-Matrix.
Figure 2B:
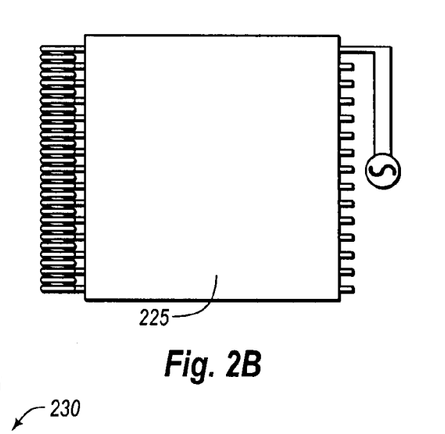
Figure 2C:
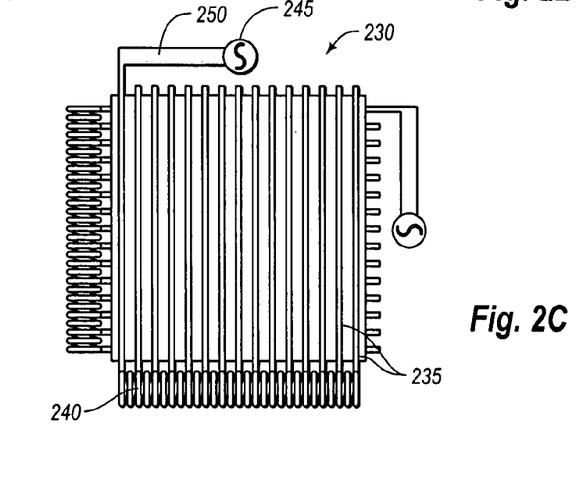

Referring to FIGS. 2A, 2B, and 2C a method for manufacturing a RF-Matrix is illustrated. The embodiments illustrated in FIGS. 2A, 2B, and 2C are different than the illustrations in FIGS. 1A, 1B, and 1C in that they utilize multiple-tapped single inductors for addressing each trace array rather than individually mounted inductors or capacitors and can be alternately configured as a series dipole array. Referring to FIG. 2A, an X-axis trace array 200 is produced on a non-conductive substrate 205. The non-conductive substrate 205 supports the circuit components and can be made at least partially of materials such as glass, plastic, and/or ceramic.

A first signal bus 210 is produced on the substrate 205. The first signal bus 210 conducts a wide range of frequencies to (or from) the X-axis trace array 200 as illustrated in FIG. 2A. Each of the traces 200 is electrically coupled to an X-axis multiple-tapped inductor 215 along the length of the inductor 215 at a location for gradually increasing inductive valves. Thus, each of the subsequent traces in the array 200 can be configured to conduct a frequency of an alternating current at a gradually higher frequency. An X-axis controller 220 is electrically coupled to the bus 210. In reactive embodiments, the X-axis controller 220 is configured to generate alternating current signals to the multi-tapped inductor 215 via the bus 210. In active embodiments, the X-axis controller 220 is configured to receive a stimulus from the X-axis trace array 200 via the bus 210.

Referring to FIG. 2B, a material 225 is produced over the X-axis trace array 200. The material changes a property of the material in response to a stimulus. The material 225 can be an active material or a reactive material. In a reactive embodiment, the material 225 can be a sheet of material (or discrete islands of material) that reacts when a current is conducted across traces located directly above and below the material 225. For example, the material can be a material that reacts to electricity or heat generated by the alternating currents and changes a property of the material as a result. For example, the property of the material can be a chemical property, spectral property, optical property, electric property, piezoelectric property, biological property, thermal property, mechanical property, molecular cohesion of the material, elasticity of the material, thermal expansion of the material, catalysis of the material, and/or luminescence of the material as well as other material properties.

Referring to FIG. 2C, a RF-Matrix 230 is illustrated according to an example embodiment. The RF-Matrix 230 is a result of the processes illustrated in FIGS. 2A and 2B along with the production of a Y-axis trace array 235 as shown in FIG. 2C. The Y-axis trace array 235 is produced over at least a portion of the sheet (or islands) of material 225 and the X-axis trace array 200. Similar to the X-axis trace array 200 illustrated in FIG. 2A, the Y-axis traces 235 are electrically coupled to a single Y-axis multi-tapped inductor 240. The multi-tapped inductor 240 selectively conducts alternating current to (or from) the Y-axis traces 235 based on the frequency of the alternating current.

A Y-axis controller 245 is electrically coupled to a Y-axis bus 250 coupled to the Y-axis inductor 240. In reactive embodiments, the Y-axis controller 245 is configured to generate alternating current signals to the Y-axis inductor 240 via the Y-axis bus 250. In active embodiments, the Y-axis controller is configured to receive stimulus from the Y-axis trace array 235 via the Y-axis bus 250. It should be appreciated that the Y-axis controller 245 can be located on the same substrate 205 as the RF-matrix 230 or on a separate substrate than the matrix 230 with electrical connection to the Y-axis bus.

The Y-axis trace array 235 can be produced such that its traces are produced substantially perpendicular (or at any angle) to the X-axis trace array 200. As shown in FIG. 2C, each of the Y-axis traces 235 directly overlay each of the X-axis traces 200 at a particular point.

In reactive embodiments, each point of intersection of the X-axis trace array 200 and the Y-axis trace array 235 can be addressed by supplying currents of a selected frequency to pass the corresponding taps of the X-axis inductor 215 to a particular X-axis trace 200 associated with the selected and a current of a selected frequency to pass the corresponding tap of the Y-axis inductor 240 coupled to a particular Y-axis trace 235 associated with the selected frequency. Thus a reaction of the material 225 can be induced at any of the intersections of the X-axis trace array 200 with the Y-axis trace array 235 by transmitting signals of an appropriate frequency to at least one of the X and Y busses 210, 250.

Multi-tapped single inductors 215 and 240 simplify the number of individually mounted components and instead rely on conductive bonds from individual multiple traces (taps) on a central column of windings. The embodiment illustrated in FIGS. 2A, 2B, and 2C can include active or reactive material 225, for example as discussed above in reference to FIGS. 1A, 1B, and 1C. In the instance that the material 225 is active material the controllers 220 and 245 include receivers for receiving (i.e. sensing) stimuli received from the material 225.

Note that when referring to the illustrations it should be appreciated that the signal bus may be of a parallel or series dipole arrangement depending on which arrangement lends itself to the least circuit resistance associated with the specific frequency choices, hence both methods are illustrated.

As illustrated in FIGS. 1C and 2C, a plurality of frequencies can be sent through a central signal bus for each axis, the signal bus may be of a parallel or series dipole arrangement. Depending on the type of arrangement lends itself to the least circuit resistance associated with specific frequency choices, thereby eliminating the need for many individually discrete multiples of traces for each row and column. Accordingly, rows and columns can be increased in density and simultaneously decreased in circuit complexity since a single bus drives the arrays of multiple traces. In addition, capacitors can be printed or etched directly onto the insulated substrate to further reduce the necessity for mounted components.

Existing surface mount inductors and capacitors, for example common to cell phones and computers, now have relatively low manufacturing costs and can be used to construct the resonant filters for each trace. A mixed plurality of bus switching and resonant filters may also be employed where cost and/or convenience are considerations. However, resonant frequency addressing can be used to great advantage in many different applications and configurations.

Surface mount inductors can be applied by existing automated equipment either individually or as complimentary resonant structures for capacitors onto preprinted circuit traces for the purposes of discrete trace array member frequency filters. Surface mount inductors can also be applied as complimentary resonant structures for inductors onto circuit traces for the purposes of discrete trace array member frequency filters. For example, inductors of only a few values can be combined in series to produce a unique higher total inductance and thereby lower resonance than those of the individual inductors. Likewise, capacitors can be combined to produce higher capacities with corresponding lower resonant frequencies than individual capacitors. Inductors can be mounted individually per each trace or can tap sections of a single continuous inductor.

One advantageous aspect is that an oscillating signal is employed directly to each pixel (i.e. intersection point) by resonant addressing. Thus, subsequent conversion to a local pixel needing direct current is unnecessary for many applications, such as for purposes of activating electroluminescent or plasma light emission. Thus, component numbers can be reduced and circuit manufacture and complexity can be simplified, thereby reducing cost and size among other benefits.

Detail and resolution controls are also extremely broad ranged. The RF-matrix can be constructed at any resolution with the number of lines limited only by the availability of size for the non-conductive base material, the resolution capability of the machinery used to apply or deposit the conductive medium, and the specifications for efficiency in the conductive medium itself (such as thickness at which the medium retains its functionality appropriate to the application).

Various media are suitable for the creation of the matrices and have predetermined conductive characteristics, which can be selectively formulated, modified, and subsequently selected as appropriate to suit the ultimate desired application of the RF activation technology. New developments in the conductive polymer field and carbon nanotubes can be used in many applications and refinements for this RF-matrix, as would be known to one of ordinary skill in the art after reading this disclosure.

The manner of each trace having its own discrete inductive or capacitive value associated thereto, allows for resonant frequency filtering, and a plurality of frequencies can be sent, through a central signal bus. This eliminates the need for many individually discrete multiples of traces for each row and column. Accordingly, rows and columns can be dramatically increased in density and simultaneously decreased in circuit complexity.

Carbon nanotubes can be grown vertically on a Z axis display layer connecting X and Y intersections, which can have emissive phosphor terminations enabling them to emit light as well. This enables the RF-Matrix to function as a CCD. If the phosphor terminations of the carbon nanotubes are eliminated, the vertical carbon nanotubes will render a net pixel gain upon absorption of light thereby increasing the signal strength from each discrete pixel location accordingly. Likewise, selenium or other light activated conductively enhanced material will also absorb photons increasing the local pixel signal strength as a gain, collectively enabling the RF-Matrix as a CCD.

2. Examples of Three-Dimensional Embodiments

The teachings set forth herein can be applied to the creation of three dimensional resonant frequency activated matrices for many applications. For example, Cartesian coordinates can be created in a layer wise deposition along a Z-axis to create a RF-matrix within a three dimensional object. The three dimensional RF-Matrix can be produced in a layer-wise fashion by overlaying several layers of individually indexed RF-Matrices, such as multiples of those layers illustrated in FIGS. 1A, 1B, 1C, or 2A, 2B, 2C.

Figure 3A:
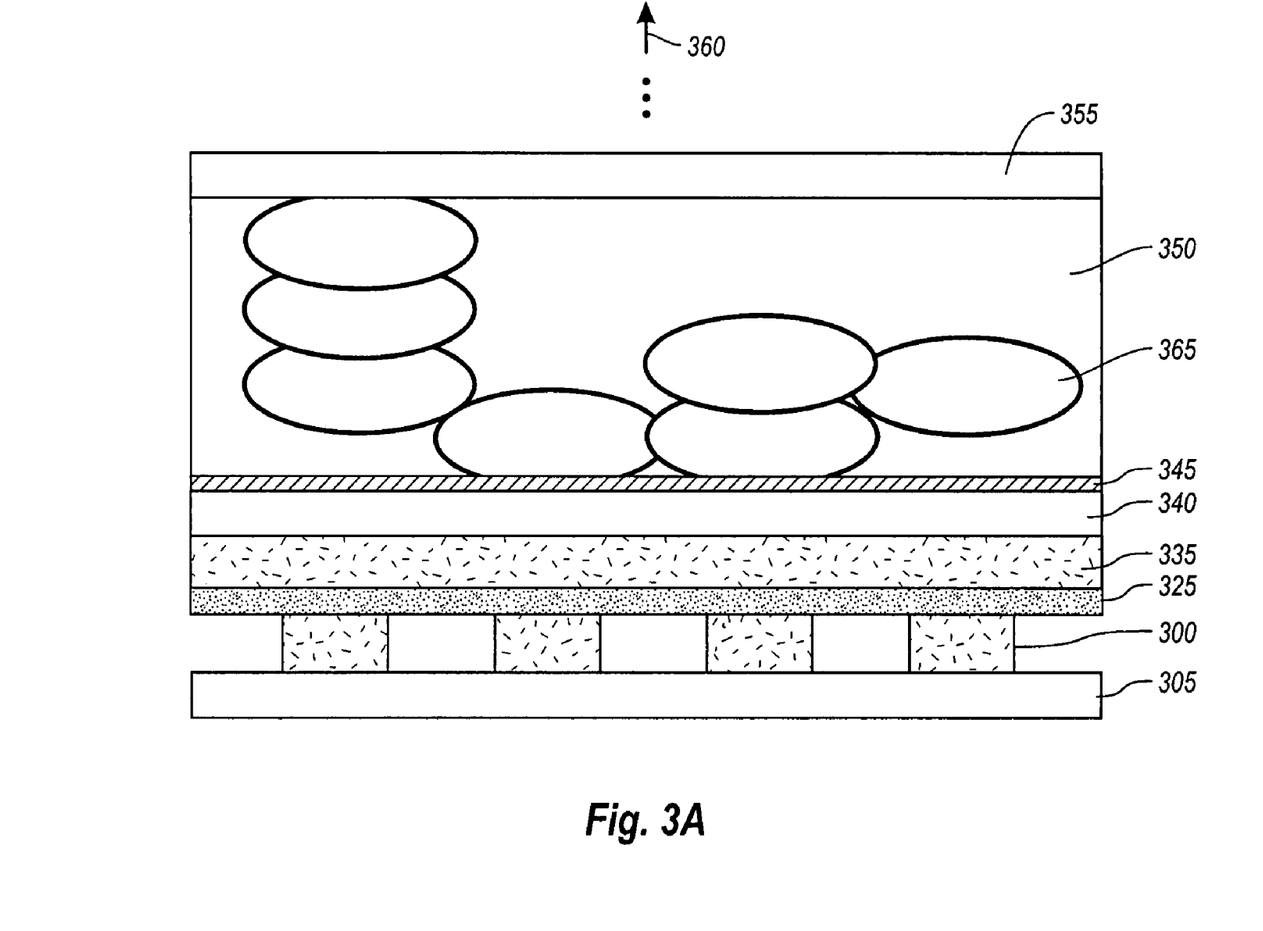
Figure 3B:
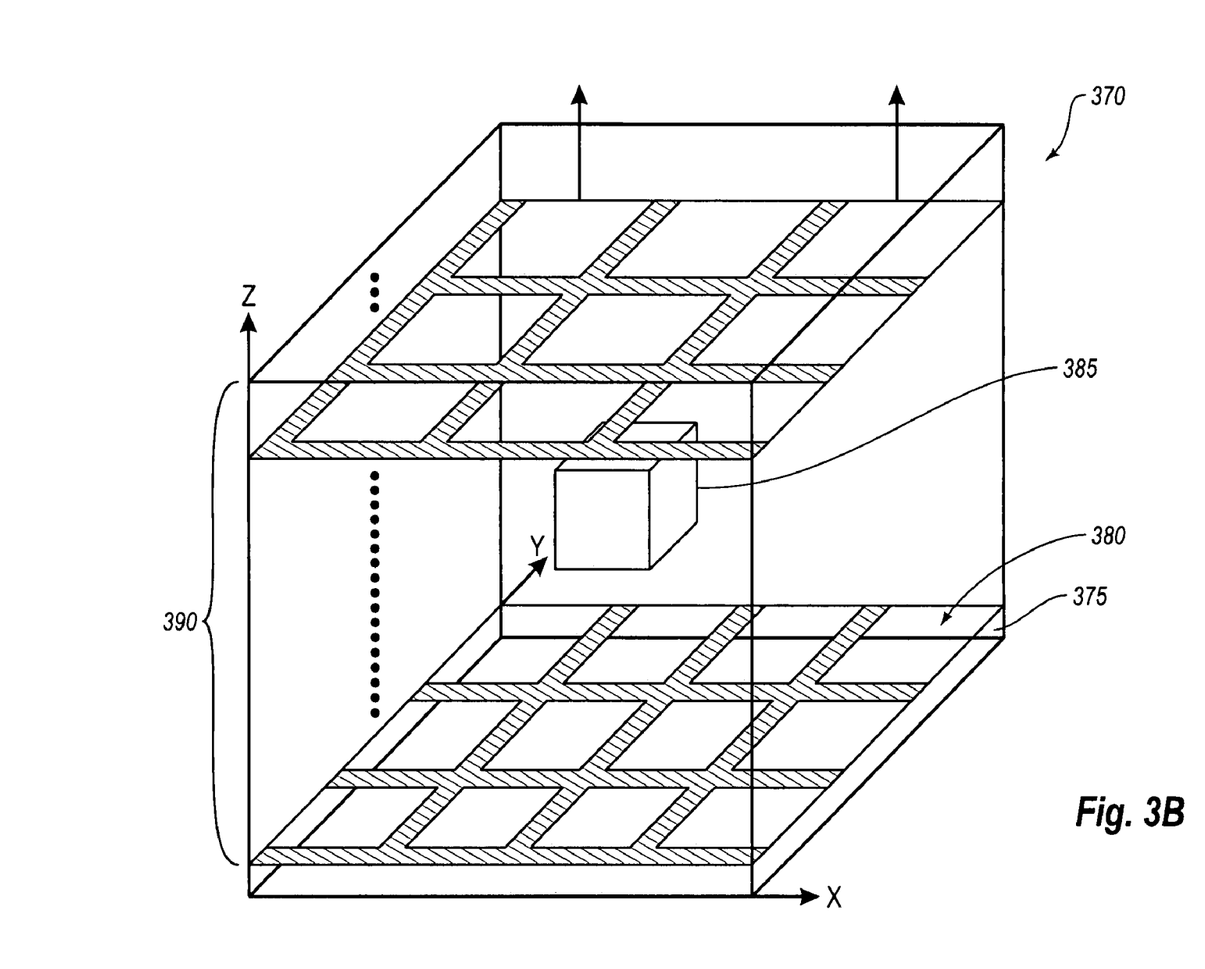
FIG. 3B illustrates an example of a three dimensional RF-Matrix.

Referring to FIGS. 3A and 3B, a method for manufacturing a RF-Matrix is illustrated. The illustrated method can be applied to an embodiment used for the selective curing of a catalyst-blocked monomer. The RF-Matrix can be used for catalysis of a liquid in selectively cured layers, serially deposited along a vertical Z-axis to create a three dimensional object in layers. Currents traveling through a poorly conductive shield or resistor film produce heat by electrical resistance. Heat can be used to selectively cure liquid monomer.

Referring to FIG. 3A, an X-axis trace array 300 is produced on a non-conductive substrate 305. The use of an X-axis, Y-axis and/or Z-axis coordinate system is used for illustrative purposes only and is not to be considered limiting of the embodiments disclosed herein. The non-conductive substrate 305 supports the circuit components and can be at least partially be made of materials such as glass, plastic, and/or ceramic. A first signal bus is produced on the substrate 305, (e.g. see illustration FIGS. 1A, 1B, 1C or 2A, 2B, 2C). The first signal bus is configured to conduct alternating current of a wide range of frequencies to the X-axis trace array 300. Each of the traces 300 is electrically coupled to a frequency selective filter (e.g. see illustration FIGS. 1A, 1B, 1C or 2A, 2B, 2C). The filters can include, for example, capacitors and/or inductors that are configured to filter electrical signals of different frequencies. Each of the subsequent filters in the array 300 can be configured to conduct an alternating current transmitted at a gradually higher (or lower) frequency. An X-axis controller (e.g. see illustration FIGS. 1A, 1B, 1C or 2A, 2B, 2C) is electrically coupled to the bus and is configured to generate alternating current signals at different frequencies to the filters via the bus.

A material 325 that changes a property in response to a stimulus is produced over the X-axis trace array 300. For example, a poorly conducting or resistive material 325 is produced over the X-axis trace array 300. The poorly conducting or resistive material 325 can be a sheet of material such as amorphous carbon that generates heat when a current is applied to traces located both above and below the material 325. The resistive material 325 may also be applied at discrete points as in a patterned sequence of the resistive material, or may be a combination of resistive materials with different properties. The resistive material may be applied at discrete points (or "islands" of material) as in a patterned sequence using various resistive materials with different properties, such materials whose respective densities create varied levels of heat reaction. Each island deposit of material can correspond to a pixel of a certain value. For example, each deposit of material can correspond to a pixel of a certain heat value required for catalysis of material to be hardened.

The resistive material 325 can be a material that changes a property of the material 325 in response to conduction of current, or heat generated by the current, in traces proximate to the material 325. The property of the material 325 can be a chemical property, spectral property, optical property, electric property, piezoelectric property, biological property, thermal property, mechanical property, molecular cohesion of the material, elasticity of the material, thermal expansion of the material, catalysis of the material, or luminescence of the material. According to one example embodiment, the material 325 is an amorphous carbon material, which responds to an alternating current signal where X and Y traces cross with resonant gains by heating and inducing catalysis in a liquid specific to this embodiment. According to another example, a mechanical property, such as the rigidity or cohesion of the material, can change in response to the alternating current.

A Y-axis layer 335 is applied atop the resistive layer 325, upon which a heat conducting layer 340 is produced. The RF-Matrix can be a result of the processes illustrated in FIGS. 1A and 1B along with the production of the Y-axis trace array 335 (e.g. see illustration FIGS. 1A, 1B, 1C or 2A, 2B, 2C). The Y-axis trace array 335 is produced over at least a portion of the sheet (or islands) of resistive material 325 and the X-axis trace array 300. Similar to the X-axis trace array 300 illustrated in FIG. 1A, the Y-axis traces 335 are electrically coupled to a plurality of Y-axis resonant frequency filters (e.g. see illustration FIGS. 1A, 1B, 1C or 2A, 2B, 2C). The Y-axis filters selectively conduct alternating current to the Y-axis traces 335 based on the frequency of the alternating current.

A Y-axis controller (e.g. see illustration FIGS. 1A, 1B, 1C or 2A, 2B, 2C) is electrically coupled to a Y-axis bus, which is electrically coupled to the Y-axis filters. According to a reactive embodiment, the Y-axis controller is configured to generate alternating current signals to each of the Y-axis filters via the bus. According to an active embodiment, the Y-axis controller is configured to receive (i.e. sense) changes in properties of the material via signals received from the Y-axis traces 335.

The Y-axis trace array 335 can be produced such that its traces are produced substantially perpendicular to the X-axis trace array 300. However, it will be appreciated that the X-axis trace array 300 and Y-axis trace array 335 can be configured to intersect at any angle, so long as at least one trace from the X-axis array and at least one trace from the Y-axis array overlap. Each of the Y-axis traces 335 can directly overlay each of the X-axis traces 300 at a particular intersection (e.g. see illustration FIGS. 1A, 1B, 1C or 2A, 2B, 2C).

According to reactive embodiments, each point of intersection of the X-axis trace array 300 and the Y-axis trace array 335 can be addressed by supplying a current of a selected frequency from the X-axis controller to pass the corresponding X-axis filter coupled to a particular X-axis trace 300, and a current of a selected frequency from the Y-axis controller to pass the corresponding Y-axis filter coupled to a particular one of the Y-axis traces 335. Thus a reaction of the material's 325 property can be induced at any point of intersection of the X-axis trace array 300 with the Y-axis trace array 335 by transmitting signals of an appropriate frequency to the X and Y busses associated with the intersecting traces.

A nonstick layer can be applied above the heat conductive material 340. Layer 340 is a heat conducting non-electro-conducting substrate upon which traces are produced. A heat conductive layer 345, such as a Teflon or silicone film, can be applied over the nonstick layer 340. Above the non-stick layer 345 is a pool of liquid monomer with a dissolved blocked catalyst 350. As the heat generated at the X-and Y-axis intersections is passed through the layers 325, 340 and 345 the liquid monomer 350 is catalyzed into solid regions 365 that have been heat-polymerized.

An adhesive or textured binding layer 355 is provided above the liquid 350 and polymerized regions 365 to which the polymerized regions adhere. As the binding layer 355 is raised along the Z-axis 360 the solidified polymerized regions move up with the binding layer 355 and release from the non-stick surface 345. Liquid monomer flows into the space created, and the next layer of polymerization occurs when the selective frequencies are applied to the RF-Matrix generating heat and creating the next solid layer. Repeating this process can selectively deposit layers of an object.

In one embodiment, to create color objects the liquid 350 contains various heat-activated dyes encapsulated and blocked for specific and individualized heat reactions. The islands of varied heat conductive substrates on the heat conduction layer 340 which have been deposited to correspond with selective coordinates are activated to selectively release or entrap specific color during catalysis or other reaction. This embodiment can generate objects in color. Three dimensional embodiments implementing active material and receivers can also be constructed.

Referring to FIG. 3B, an overview of the three dimensional object-creation embodiment is illustrated. For example, referring to FIG. 3B, a three dimensional RF-Matrix 370 is illustrated. A support surface 375 can include a non-stick surface for having a first RF-Matrix layer 380 produced thereon. The first layer 380 of the three dimensional RF-Matrix 370 can be produced using any of the methods described above in reference to FIGS. 1A, 1B, and 1C or 2A, 2B, and 2C. As described, RF-Matrix 370 can be constructed of a two-dimensional polymerization matrix with additional layers 390 of RF-matrices produced in a vertically layered configuration creating the three-dimensional RF-Matrix 370 from which an object 385 can be produced by selective polymerization according to a reactive embodiment. The selective polymerization can be accomplished by applying particular resonant frequencies to each the X and Y oriented buses of selected layers 375 and 390 of RF-Matrix 370 in order to cause a catalysis of the intermediate material at desired X, Y, and Z locations. Once the desired portions of the three-dimensional RF-Matrix 370 have been polymerized, the excess material can be removed leaving the rapidly prototyped object 385.

3. Examples of Applications for RF-Matrices

Many different embodiments are contemplated due to the wide range of applications of the RF-Matrix. Embodiments of the present invention include any device incorporating the RF-Matrix as well as the various embodiments for the RF-Matrix alone. Examples of the many embodiments that can incorporate the RF-Matrix include, but are not limited to displays, sensors, rapid prototyping devices, manufacturing devices, CCDs, digital cameras, telescopes, image recording devices, microscopy devices, memory chips, electronic papers, printing devices, heated pixel arrays, selective high density radio signal routing devices, touch screens, index tables, robotic tactile sensors, acoustical mapping devices, sound filtering devices, audio recording devices, amplification devices, sound wave direction sensors, sound source identification devices, motion detection devices, and integrated circuits.

According to an example reactive embodiment, the material is an electro-luminescent layer, which responds to an alternating current signal where X and Y traces cross with resonant gains by changing a spectral property and inducing a photon emission from a change in electronic energy states thereby producing a luminance. According to another reactive example, a mechanical property, such as the rigidity of the material or cohesion of the material changes in response to the alternating current. According to another reactive example, instead of an electro-luminescent sheet of material being sandwiched between the X and Y layers, the material may also be applied as discrete islands as in a patterned sequence using various materials with different properties, such as color or density, printed upon a carrier film. Each island deposit of material can correspond to a pixel of a certain value.

In addition to resolution and size flexibility, the malleable properties of the material comprising the matrix layers itself may in fact generate matrices that are functional in a variety of two-dimensional and three-dimensional shapes and configurations according to both active and reactive embodiments. The RF-matrices can be sculpted or molded to complex curves, or shaped for projection onto topographically non-uniform surfaces to create a correct reading image. An example of this includes, but is not limited to, a display surface that is curved or can be formed to take on virtually any shape such as around a column, or a sphere. This shape variation may be limited to the degree that the conductive materials and the base surface are of equal degrees of plasticity, elasticity, or other property, to provide for a topographically non-uniform surface without loss of functionality.

Greater brilliance by electro-luminescent material with less energy can be achieved because a greater emission angle from emitted light pixels is possible with this method since the emission source can be placed much closer to the visual surface of the display, where previous layers of masks caused diffractive interference and shadows in other types of displays.

The RF-Matrix can be used for applying electrical currents that produce localized pixels of heat, which in turn can activate or unblock heat sensitive form radical or cationic catalysis, thus inducing a wide variety of polymerization chemistries. In addition, other polymerization reactions can be accelerated by heat such that if a small localized matrix of heat pixels is used to pattern sequential layers of a 3-D object, the time delays in its construction due to mechanical machine movements can be drastically reduced and the consequent construction of a finished product can be expedited by at least two orders of magnitude. Some polymerization reactions are so fast that they occur in a fraction of a micro-second, effectively limiting construction time to the rapidity of the heat signals. Thus, the RF-Matrix can provide for two dimensional and three dimensional manufacturing processes, such as rapid prototyping and other applications, in a simple manner. In addition, the potential for greater versatility in the rapid prototyping industry is enhanced because the RF-Matrix can be addressed at any size or combination of sizes. Combinations of multiple RF Matrices of different sizes and configurations can also be implemented.

In the case of utilizing the RF-Matrix for catalysis in this way, the initial conductive material (e.g. X-axis) printed upon, applied to, or selectively ablated from the non-conductive base may not need to be transparent, nor would subsequent layers, since no electro-luminescent film is sandwiched between the layers. This rapid addressing RF-Matrix enables the curing of XJY planar strata stacking and successively curing along a Z axis in a simple manner. Thus, the RF-Matrix can be used as a rapid prototyping system with minimal mechanical parts.

The RF-Matrix can also be used for two and three dimensional printing applications. For example, the matrix can be used to selectively fuse toner, thermographic powder or cure ink for quick printing, such as monochrome or full color images.

The RF-Matrix can also be used for controlling the temperature gradient beneath a flat plane of a focal curved surface, such as a spherical, circular, toroidal, ellipse, ellipse of rotation, parabola, parabola of rotation, hyperbola or hyperbola of rotation, such that optics (reflective or transmissive) can be controlled. Thus, embodiments, such as sonar equipment, medical lithotripters, and other acoustic or shock wave modulated devices including the RF-Matrix have a means to more perfectly control the projected reflections of wave front geometry with precise temperature controlled surfaces by implementing the RF-Matrix.

The RF-Matrix can also be used to control propagation of energy. For example, the energies of acoustic and other shock wave fronts are known to be extremely sensitive to temperature variations. For instance, the shock wave emanating from, or reflected off of, a cold surface will typically lose more energy than the shock wave reflected off of a hot surface. Thus, a temperature profile on a reflective or transmissive surface can be controlled using an RF-Matrix thereby controlling the temperature of a surface and propagation of energy emanating from, or reflected off of, the surface.

According to another embodiment, carbon nanotubes can be grown vertically on a Z-axis display layer connecting X and Y intersections. These intersections can have emissive phosphor terminations enabling them to emit light also. Thus, three dimensional displays can be created by such embodiments.

RF Matrices can also be utilized to create displays that are viewable from both front and back, in that the X and Y traces can all be created in the transparent conductive material separated by the electro-luminescent layer and masked with appropriate pixel masking film on both sides of the display.

Figure 4:
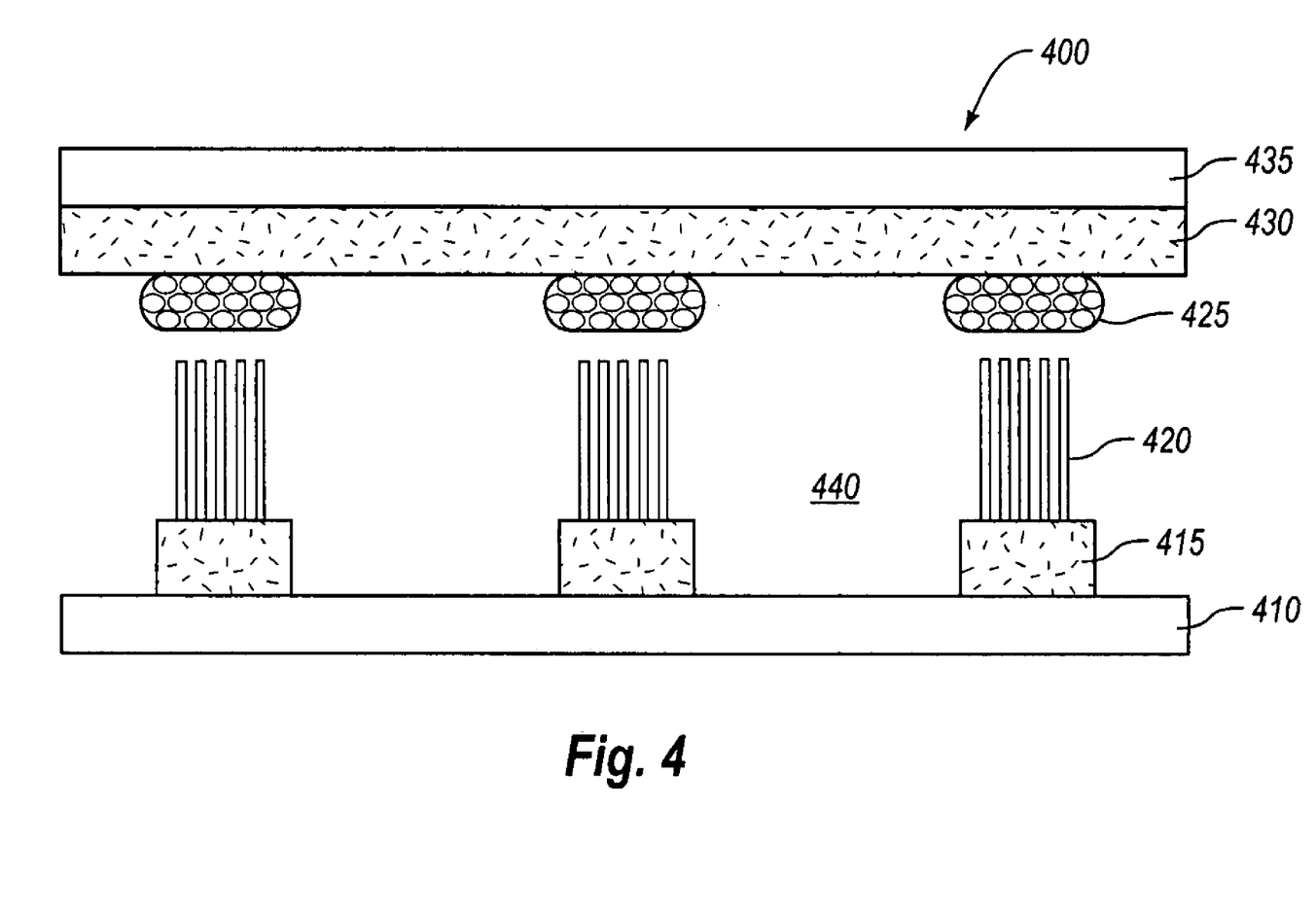
FIG. 4 illustrates a RF-Matrix.

For example, referring to FIG. 4, the RF-Matrix is illustrated according to an example embodiment for use with carbon nanotubes grown by CVD or other process known in the art for the purpose of selective electron emission. Electrons excite specifically applied phosphors and cause them to emit light at specific intersection points of X- and Y-axes. The Cartesian intersection points can be used to selectively activate phosphors. This embodiment can be created as a sealed vacuum construct as described hereinafter.

An X-axis trace array 415 is produced on a non-conductive insulating substrate 410. The use of an X- and Y-axis is used for illustrative purposes only and is not to be considered as limiting the scope of the present invention. The non-conductive substrate 410 supports the circuit components and can be at least partially made of materials such as glass, plastic, or ceramic. A first signal bus is produced on the substrate 410, (e.g. see illustration FIGS. 1A, 1B, 1C or 2A, 2B, 2C). The first signal bus is configured to conduct alternating current of a wide range of frequencies to the X-axis trace array 415. Each of the traces 415 is electrically coupled to a frequency selective filter (e.g. see illustration FIGS. 1A, 1B, 1C or 2A, 2B, 2C). The filters can include, for example, capacitors and/or inductors that are configured to filter electrical signals of different graduated frequencies. Thus, each of the subsequent filters in the array 415 can be configured to conduct an alternating current transmitted at a gradually higher (or lower) frequency. An X-axis controller (e.g. see illustration FIGS. 1A, 1B, 1C or 2A, 2B, 2C) is electrically coupled to the bus and is configured to generate alternating current signals at different frequencies to the filters via the bus. It should be appreciated that the controller can be located on the same substrate 410 as the resulting RF-Matrix or a separate substrate than the RF-Matrix with electrical connections for providing the alternating current to the bus.

A carbon nanotube material 420 is produced over the X-axis trace array 415, e.g. using CVD or another method. An insulating substrate 435 is produced with Y-axis traces 430 (e.g. in the same manner illustrated in FIGS. 1A, 1B, 1C or 2A, 2B, 2C). Next, selectively applied dots of phosphor 425 are produced at discrete points, such as in a patterned sequence on top of the Y-axis traces, on top of the of the insulating carrier substrate 435, and/or may be a combination of selectively applied phosphor materials with different properties applied thereupon. The phosphor material may be applied at discrete points (or "islands" of material) as in a patterned sequence using various luminous materials with different properties, such materials whose density create varied levels of spectral reaction or color. Each island deposit of material can correspond to a pixel of a certain value. For example, each deposit of phosphor material can correspond to a pixel of a certain value required for excitation of phosphor material to be activated.

When current is generated at the selected Cartesian X- and Y-axis intersection point, the carbon nanotubes 420 emit electrons which, in the vacuum space, excite the phosphor 425 printed directly above, and cause the phosphor 425 to emit light for display purposes. In one embodiment, various color phosphors such as those found in red, green and blue dots of a display can be selectively applied and activated to create color images.

In operation of reactive embodiments, the resonant frequencies of intersecting traces are activated to generate power at the intersection point. The pre-tuned frequency resonance of the intersections of, or Cartesian solutions for, the X- and Y-axis (which can be orthogonal at some angle) create a current conducted through the material on a Z-axis between the X and Y layers. This provides power for activation of the material at the intersection point between the X and Y layers. For example, where the material is electro-luminescent or plasma, the activation of the material creates an activated pixel of light at the intersection. The material can be in solid, liquid, or gas state or any combination of solid, liquid and gaseous material. For example, the material can include a phosphorus based gaseous material encapsulated in a plastic chamber. In this embodiment, scanning intersections of pixels over the matrix at rapid speed creates a display addressed by the RF-Matrix unit. The RF-Matrix can be connected to a tuning chip, which translates incoming data from a television receiver or a computer into images displayed by the RF-Matrix.

The addition of a visually transparent mask layer upon which has been printed a visually opaque black mask in visually opaque ink in a grid pattern that corresponds with the Cartesian coordinates of the intersection of X- and Y-axis, can delineate the burst of light into a pixel-like shape with cleaner edges, thereby generating a screen dot or other shape, or point of light, which works together with the others to create the moving images in an orderly fashion wherein the light from one pixel does not unduly cloud or diffuse the next. This mask creates the screen or filter definition for each pixel printed at the appropriate resolution to match the grid of the matrix. Utilization of directional light conducting materials can perform a similar function.

In addition to the outer edge pixel masking dyes in red, green and blue can be used within the transparent areas to create the red, green and blue pixels that comprise the screen images. According to a RF-Matrix display embodiment, the same dye treatment is applied when selected as an appropriate option for RGB images. Image information is received and translated according to the application. Selected grid patterns are produced by customized resonant frequency generation to activate pixels which generate the appropriate RGB image.

A plurality of similar color activations can be used in this invention depending on the application. For example, inks, e-inks, cyan, magenta, yellow and black color separation technology, selected premixed ink or dye colors, selected premixed ink or dye colors in metallic, iridescent, pearlescent, microencapsulated materials (E-ink, Gyricon, NTerra, Sipix), electrophoretic, cholesteric, electrochromic, electrowetting, liquid crystal, or other varied finishes or materials can be used.

Active embodiments of the RF-Matrix can also be used in sensors or other devices. For example, the matrix 130 can include an active material 125 to generate a pressure matrix. According to these embodiments, an active type of material 125 generates matrix stimulation and can include elastomeric materials of low durometer such as, but not limited to, polyurethane, butyl rubber, or silicone rubber. Since the capacitive index of the elastomeric layer changes under compression, when pressure is applied either by stylus, finger or other object, the resultant localized change in signal amplitude value at the touch point is picked up by the X and Y intersections of the matrix 130. Accordingly, this embodiment provides address points over time which can be registered by microprocessing for touch screen, tracking trajectories on an index table, robotic tactile sensors, or other sensing devices.

Other embodiments of the matrix 130 with an active material 125 between the X- and Y-axis traces 100 and 135 include acoustical mapping devices. Utilizing the active material 125 such as a film including any active material, or combination of active materials, such as piezo materials of, but not limited to, quartz, barium titanate, lead niobate, lead zirconate titanate, and/or piezo active plastic films such as polyvinylidinefluoride (sometimes also referred to by the trademark KYNAR). These piezoelectric materials respond to external stimulus, such as sound waves which liberate localized electrons at the various X,Y junctions to create amplitude gains. These gains provide address points over time which can be registered by microprocessing for sound filtering, recording, amplification, sensing sound wave direction, high definition sound source identification, and motion detection, among other applications. Of particular importance is phase time reverse wave propagation, which can be used for audio mirroring, used for example, to isolate sound sources such as single voices from a crowded room. Acoustical transducer arrays can throw back a sound signal in reverse into the mouth of the sender which can be used for sophisticated echo location devices, including but not limited to, underwater submarines, nautical robots, or night vision.

Another active-layer embodiment of the invention utilizes a material 125 including semiconductive active materials, which can serve as photoelectric layers or pyroelectric layers (peltier junction) such as but not limited to materials including silicon or germanium. These embodiments enable photo-optic detection through the visible light spectrum into the infrared, or provide thermoelectric sensing. Each X,Y junction of the X and Y trace arrays 100 and 135 serve as a photon-electron converter as the active material 125 responds to light. This allows for localized detection at the X and Y interfaces which provides address points over time, which can then be registered by microprocessing for image reinformation, (e.g. serving as a CCD). Thus, peltier junction layers can be used in the same manner but for infrared imagery.

According to other embodiments, the RF-Matrix 130 can be used as a sensor key to read fingerprints. For example, the matrix 130 can be implemented in a dimpled card or a device with a relief pattern, using the active light or pressure sensitive material 125 at resolutions appropriate to the item intended to be scanned, (e.g. fingerprint would require a finer resolution than a credit card).

The RF-Matrix can be used for biological applications. For example the material can be a protein and the protein can be located at the intersection of one of the coordinates. The resonance of the protein can be measured. The resonance will change if it hybridizes (binds) with another protein. This would provide a 100% hybridization confidence, a capability not available with any of today's technology (i.e. drug discovery, toxicology, drug screening, etc.).

According to another example, a film embedded with microparticles of magnetically responsive material embodiment, such as but not limited to microparticles of iron oxide, can be used for read/write memory. In "write" mode, as various points of X-Y intersections are activated it would produce localized magnetic field gradients creating a pattern in the iron-oxide which can then be read by the matrix in "read" mode. These patterns would not change until rewritten by X-Y magnetic field changes. Each location can be recorded not only as binary data, but as stepped amplitude values and variations between one to one hundred or more allowing for greater memory storage per unit location. This increases the storage density capacity of a chip by at least one order of magnitude; for instance a one square centimeter chip with a thousand lines for each X and Y trace array can conceivably record one billion bytes of information (1 GB RAM).

As discussed above, the RF-Matrix can be incorporated into a CCD. Embodiments including such CCDs containing grids of pixels include digital cameras, optical scanners and video cameras, for example, as light-sensing devices. These embodiments are commonly more efficient than photographic film, which captures a much lower percentage of the incident light. As a result, CCDs are also becoming rapidly adopted by astronomers. Thus, RF-Matrix embodiments can be used to create CCDs for sensing light according to any configurations and applications.

4. Examples of Processes for Manufacturing an RF-Matrix

The embodiments discussed herein can be adapted to several manufacturing processes. For example, referring to FIG. 5, a flow diagram illustrating a method for manufacturing a RF-Matrix is shown. At 500, a non-conductive substrate is provided. The substrate can be made from a non-conductive base material that can be sized appropriately for a particular application. Examples of suitable insulated material include, but are not limited to, glass, plastic, or ceramic.

Figure 5:
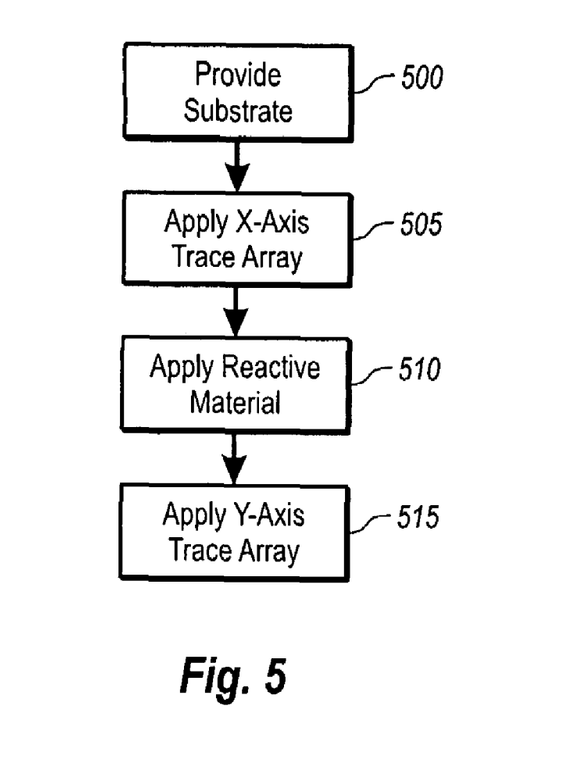
FIG. 5 illustrates a method for manufacturing a RF-Matrix.

At 505, an X-axis trace array is applied to the top surface of the substrate. Many different types of conductor material can be used to produce the trace arrays and other circuit components. For example, in addition to transparent conductors, such as tin oxide, indium tin oxide, cadmium stannate and zinc oxyflouride, a new class of organic plastic transparent conductors such as 3,4-polyethylene dioxythiophene-polystyrene sulfonate PEDOT materials, for example, are suitable as well. PEDOT can be cross linked from the monomer form or used in a waterborne dispersion that forms a clear conductive film when dried, and is a suitable economical alternative to the sputtering of ITO and other inorganic coatings. Transparent carbon nanotube film can also be used and is a class of conductive transparent material well-suited for many applications and embodiments discussed herein. The RF-activated circuit constructs disclosed herein can also be tailored or customized with material selection best suited to the requirements of a given application.

The trace material can be transparent and/or opaque depending on the application of the materials. Examples of suitable methods for application of the conductive material to the substrate include, but are not limited to, flexo, gravure, offset printing, (subtractive) laser-ablation, silkscreen, chemical vapor deposition, vacuum sputtering, photolithography, electroforming, nanoimprinting, transfer printing, and/or inkjet. The traces and other circuit components can also be pre-made and affixed to the substrate, for example by means of adhesive or other attachment method. Any one, or combination of, these processes, as well as others, can be utilized to create the first layer of conductive material.

According to an embodiment, the pattern of X-axis traces can be printed or applied at the desired resolution or lines per inch with a pattern compatible with selected capacitors or inductors. For example, an electroless solution reduction process can be used to apply silver, or other, metallic material to the top surface of the substrate. A 'Dow Process' for creating aluminum traces can also be used by printing the traces and applying a finish wash.

The X-axis trace pattern can be printed in a conductive medium, or a film of conductive material. For example, conductive material suitable for such traces includes, but is not limited to, electro conductive polymer, 3,4-polyethylene dioxythiophene-polystyrene sulfonate (PEDOT). Conductive transparent metals such as indium tin oxide or others that are common in the art can also be used. Opaque metals or other conductive material can also be used. A preconstructed film of conductive carbon nanotube can be utilized as well.

At 510, material is produced over at least a portion of the X-axis traces. The material changes a property in response to a stimulus. The material can be an active or reactive material. According to reactive embodiments, the material changes a property in response to a stimulus originating from the matrix. For example, the material reacts to alternating currents, or heat produced by alternating currents conducted through the traces by changing a property of the material. According to active embodiments, the material changes a property in response to a stimulus originating from a source other than the matrix.

The material can be any material that changes a chemical property, spectral property, optical property, electric property, piezoelectric property, biological property, thermal property, mechanical property, molecular cohesion of the material, elasticity of the material, thermal expansion of the material, catalysis of the material, or luminescence of the material (or a combination of properties) in response to a stimulus, such as application of alternating currents, an electric, magnetic, mechanical, chemical, biological, optical, electro-magnetic, particle displacement, acoustic, or thermal stimulus.

For example, the material can be an electro-luminescent film layer such as an acrylic polymer encapsulated with tin sulfide copper-doped halide-modified material or plastic material designed to be luminescent under an alternating electric field, or other material known in the art for this purpose. The electro-luminescent material can be a pigment in a monomer suspension (i.e. ink). The material can also be a material that catalyzes in response to the alternating current thereby changing a mechanical property of the material. The material can also be an active material that changes a property of the material in response to a stimulus originating from a source other than the matrix. The material can be a sheet of material applied over the X-axis traces or can be islands of material applied at points where X-axis traces will intersect Y-axis traces. Different types of material can be applied at different locations to have different reactions to the application of alternating current at the different locations.

At 515, Y-axis conductive traces are produced over at least a portion of the material. The Y-axis layer of conductive traces can be produced perpendicular to the X-axis layer of conductive traces or at any angle to the X-axis trace array. The Y-axis trace pattern can be produced in accordance with any of the processes discussed herein regarding production of the first layer of X-axis traces, as well as others. For example, the Y-axis trace layer can be printed in a conductive material, such as, but not limited to, electro conductive polymer, such as 3,4-polyethylene dioxythiophene-polystyrene sulfonate (PEDOT), or conductive transparent metals such as indium tin oxide or any others that are common in the art. This conductive material can be transparent or opaque depending on the particular application. For example, for creating a display the use of transparent conductive material can be particularly advantageous. The third layer can also be a smooth high quality transparent glass or plastic film with preprinted Y-axis traces with transparent conductor material.

Another class of transparent conductor which functions well for small addressable traces and has good transparency and conductivity for very thin layers, is carbon nanotube film. Both single-walled nanotubes (SWNTs) and multi-walled nanotubes (MWNTs) are suitable in films which are mostly transparent to visible light. Carbon nanotube manufacturing costs have been declining steadily and liquid dispersions of carbon nanotubes have been found to make particularly good films of high enough quality for many embodiments.

The Y-axis trace pattern can also be ablated, wherein a film of conductive material is applied and subsequent to its curing, a pattern is ablated from such conductive material, to create a pattern of Y-axis traces of conductive transparent material. A preformed circuit in appropriate pattern can also be affixed to the carrier film such as carbon nanotube film. Methods of application of this conductive material include, but are not limited to, flexo, gravure, offset printing, (subtractive) laser-ablation, silkscreen, chemical vapor deposition, vacuum sputtering, photolithography, electroforming, inkjet, or other circuit pre-made and affixed by means of adhesive or other method to the carrier film; these and others can be utilized depending on specifications for the application.

The X- and Y-axis layers are affixed about the material. For example, the X- and Y-axis layers can be registered with respect to the other layer, pressed together with ultra-violet or heat applied to cure and bond the layers. Any means for affixing the layers can be used.

Additional layers can be applied depending on the application. For example, a fourth layer can be produced over the third layer. The fourth layer can be a film of selectively transparent carrier film, plastic, glass, ceramic, or any other material that may be familiar in the art. This fourth layer can provide protection of the underlying layers, include colors and graphics, and provide mechanical interfaces for electrical connections, rigidity if desired, or can be applied for other purposes. The surface of an overlayed color material, or the material, can be tailored to accomplish a plurality of objectives at various resolutions and at various sizes. Multiple additional layers including arrays of additional traces and layers of material can be created, for example as discussed above with reference to FIG. 3.

Figure 6:
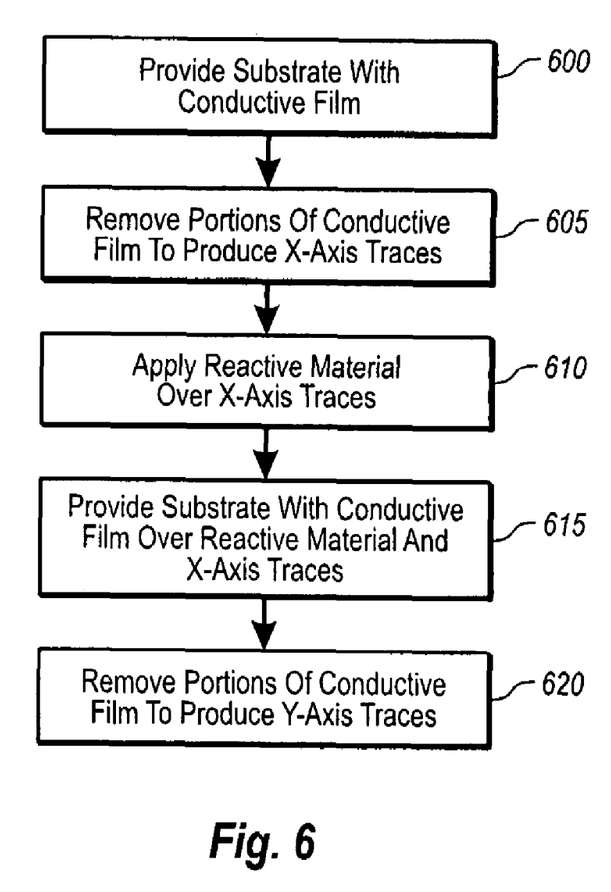
FIG. 6 illustrates a method for manufacturing a RF-Matrix.

As discussed above, the traces can be produced using a subtractive process, such as laser ablation. Referring to FIG. 6, a method for producing an RF-Matrix is illustrated. At 600, a substrate is provided with a conductive film. The substrate and conductive film can be at least partially translucent. At 605, a portion of the conductive film is removed to produce X-axis traces. The conductive film can be removed using a laser ablation process. The conductive film can be laser ablated in specific locations leaving the X-axis traces. The traces can include tin oxide, indium tin oxide, cadmium stannate, zinc oxyflouride, poly(3,4-ethylenedioxythiophene), and/or carbon nanotubes, for example. Resonant frequency selective filters, such as capacitors and/or inductors, can be produced to provide the resonant frequency busses. These resonant frequency selective filters can be discrete components and/or a single multi-tapped inductor as discussed above.

At 610, a material is applied over at least a portion of the X-axis traces. The material can be a sheet of material or can be "islands" of material, which can be applied at locations of intersection upon the X-axis traces. The material changes a property in response to a stimulus. The material can be an active or reactive material as discussed above. The material can be a material that reacts to alternating current by changing a property of the material. The property can be a chemical property, spectral property, optical property, electric property, piezoelectric property, biological property, thermal property, mechanical property, molecular cohesion of the material, elasticity of the material, thermal expansion of the material, catalysis of the material, and/or luminescence of the material. The material can be applied by a lithographic process, for example.

At 615, a substrate with a conductive film is provided over the material and X-axis traces. The substrate and/or conductive film can be at least partially translucent. At 620, a portion of the conductive film is removed to produce Y-axis traces. The conductive film can be removed using a laser ablation process. The conductive film can be laser ablated in discrete locations leaving the Y-axis traces. The Y-axis traces can include tin oxide, indium tin oxide, cadmium stannate, zinc oxyflouride, poly(3,4-ethylenedioxythiophene), and/or carbon nanotubes, for example. Resonant frequency selective filters, such as capacitors and/or inductors, can be produced to provide the resonant frequency busses for the Y-axis traces. These resonant frequency selective filters can be discrete components or a single multi-tapped inductor as discussed above.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
   a first electrically conductive trace configured to conduct an alternating current, the first electrically conductive trace having a first associated characteristic resonant frequency;
   a second electrically conductive trace configured to conduct an alternating current, the second electrically conductive trace having a second associated characteristic resonant frequency, the second electrically conductive trace intersecting the first electrically conductive trace at a first intersection; and
   a material located at the first intersection, the material having a property that changes in response to a stimulus.

2. An apparatus according to claim 1, wherein each of the associated characteristic resonant frequencies are defined by an inductive or a capacitive value.

3. An apparatus according to claim 1, wherein the material includes a reactive material that receives the stimulus from the first and second electrically conductive traces.

4. An apparatus according to claim 1, wherein the material includes an active material that receives the stimulus from a source other than the first and second electrically conductive traces.

5. An apparatus according to claim 1, wherein the stimulus includes at least one of an electric, magnetic, mechanical, chemical, biological, optical, electromagnetic, particle displacement, acoustic, or thermal stimulus.

6. An apparatus according to claim 1, wherein the property is at least one of a chemical property, spectral property, optical property, electric property, piezoelectric property, biological property, thermal property, mechanical property, molecular cohesion of the material, elasticity of the material, thermal expansion of the material, catalysis of the material, or luminescence of the material.

7. An apparatus according to claim 1, wherein at least one trace is manufactured using at least one of the following methods: flexographic printing, gravure printing, offset printing, laser-ablation, silkscreen printing, chemical vapor deposition, vacuum sputtering, photolithography, electroforming, a lithographic process, nanoimprinting, transfer printing, or inkjet printing.

8. An apparatus according to claim 1, further comprising:
   a third electrically conductive trace having a third associated characteristic resonant frequency, the third electrically conductive trace intersecting at least one of the first electrically conductive trace or the second electrically conductive trace at a second intersection; and
   a second material located between the third trace and at least one of the first or the second trace at the second intersection, the second material having a property that changes in response to a stimulus.

9. A matrix of intersecting frequency filtered arrays, the matrix comprising:
   a first array of first electrically conductive traces configured to conduct an alternating current, each of the first electrically conductive traces having a different associated characteristic resonant frequency;
   a second array of second electrically conductive traces configured to conduct an alternating current, each of the second electrically conductive traces having a different associated characteristic resonant frequency, wherein intersections of the first electrically conductive traces and the second electrically conductive traces define a two-dimensional grid; and
   a material located between at least a portion of the first array and the second array, the material having a property that changes in response to a stimulus.

10. A matrix according to claim 9, wherein the first electrically conductive traces have associated characteristic resonant frequencies of a progressively higher frequency in a given direction across the first trace array, and wherein the second electrically conductive traces have associated characteristic resonant frequencies of a progressively higher frequency in a given direction across the second trace array.

11. A matrix according to claim 9, wherein the material includes at least one of a reactive material that receives the stimulus from the matrix or an active material that receives the stimulus from a source other than the matrix and induces a second stimulus to the matrix.

12. A matrix according to claim 9, wherein the stimulus includes at least one of an electric, magnetic, mechanical, chemical, biological, optical, electro-magnetic, particle displacement, acoustic, or thermal stimulus.

13. A matrix according to claim 9, further comprising:
    a first bus electrically coupled to the first electrically conductive traces via at least one of or a combination of discrete capacitors, discrete inductors, or a single multi-tapped inductor; and
    a second bus electrically coupled to the second electrically conductive traces via at least one of or any combination of discrete capacitors, discrete inductors, or a single multi-tapped inductor.

14. A matrix according to claim 9, wherein the property is at least one of a chemical property, spectral property, electric property, piezoelectric property, mechanical property, optical property, biological property, heat activated color, elasticity of the material, a catalysis of the material for creating an object, a luminescence of the material for displaying an image, a cohesion of the material for creating an object, an expansion of the material for controlling an optic, a change in temperature of the material for changing the absorption of energy by the material, a polymerization of the material for printing an image, or wherein the property of the material responds to light as part of a charged coupled device.

15. A matrix according to claim 9, wherein the first and second trace arrays are produced using one or more of the following methods: flexographic printing, gravure printing, offset printing, laser-ablation, silkscreen printing, chemical vapor deposition, vacuum sputtering, photolithography, electroforming, a lithographic process, nanoimprinting, transfer printing, or inkjet printing.

16. A matrix according to claim 9, wherein the substrate and traces are made from a material that is at least partially translucent.

17. A matrix according to claim 9, wherein at least one of the traces includes at least one of tin oxide, indium tin oxide, cadmium stannate, zinc oxyflouride, poly(3,4-ethylenedioxythiophene), silver, nickel, magnesium oxide, gold, a metal, a polymer, or carbon nanotube, or any combination thereof.

18. A matrix according to claim 9, further comprising:
    a third array of third electrically conductive traces, each third electrically conductive trace having a different associated characteristic resonant frequency, wherein points of intersection of the first array, second array, and third array defines a three-dimensional grid of intersection points; and
    the material also being located between at least a portion of the second array and the third array.

* * * * *

UNITED STATES PATENT AND TRADEMARK OFFICE
CERTIFICATE OF CORRECTION

PATENT NO. : 7,427,201 B2
APPLICATION NO. : 11/330458
DATED : September 23, 2008
INVENTOR(S) : Milton D. Meisner It is certified that error appears in the above-identified patent and that said Letters Patent is hereby corrected as shown below:

Column 2
Line 2, change "are" to --is--

Column 3
Line 14, "1. Example Two-Dimensional" to --1. Example of Two-Dimensional--
Line 21, change "is" to --are--
Line 65, change "stimulus" to --stimuli--

Column 4
Lines 17-18, change "electro-luminescent" to --electroluminescent--
Line 61, change "particular a" to --particular--

Column 6
Line 35, remove "selected and a"
Line 36, remove "current of a"
Line 59, change "axis, the" to --axis. The--
Line 60, change "arrangement." to --arrangement--
Line 61, change "Depending" to --depending--
Line 61, change "arrangement lends" to --arrangement that lends--

Column 8
Line 11, change "layer wise" to --layer-wise--
Line 32, remove "be"

Column 9
Line 16, change "layer" to --material--
Line 61, change "nonstick layer" to --nonstick layer 345--
Line 62, change "material" to --layer--
Line 64, remove "345"
Line 65, change "340" to --345--

Column 10
Line 9, change "surface" to --layer--
Line 14, change "liquid 350" to --liquid monomer 350--
Line 39, change "to each the" to --to each of the--
Line 40, change "375" to --380--
Line 66, change "electro-luminescent" to --electroluminescent--

UNITED STATES PATENT AND TRADEMARK OFFICE
CERTIFICATE OF CORRECTION

PATENT NO.         : 7,427,201 B2
APPLICATION NO. : 11/330458
DATED                  : September 23, 2008
INVENTOR(S)       : Milton D. Meisner It is certified that error appears in the above-identified patent and that said Letters Patent is hereby corrected as shown below:

Column 11
Line 7, change "electro-luminescent" to --electroluminescent--
Line 29, change "electro-luminescent" to --electroluminescent--
Line 56, change "RF Matrices" to --RF-Matrices--
Line 62, change "electro-luminescent" to --electroluminescent--
Line 64, change "XJY" to --X/Y--

Column 12
Line 33, change "RF Matrices" to --RF-Matrices--
Line 36, change "electro-luminescent" to --electroluminescent--
Line 48, remove "used"

Column 13
Line 39, change "electro-luminescent" to --electroluminescent--
Line 51, change "layer upon" to --layer, upon--

Column 14
Lines 37-38, change "polyvinylidineflouride" to --polyvinylidinefluoride--
Line 61, change "serve" to --serves--

Column 15
Line 6, change "fingerprint" to --a fingerprint--
Line 60, change "oxyflouride" to --oxyfluoride--
Line 62, change "PEDOT" to --(PEDOT)--

Column 16
Line 10, change "laser-ablation" to --laser ablation--
Line 14, change "pre-made" to --premade--
Line 23, change "'Dow Process'" to --"Dow Process"--
Line 54, change "electro-magnetic" to --electromagnetic--
Line 56, change "electro-luminescent" to --electroluminescent--
Line 61, change "electro-luminescent" to --electroluminescent--

Column 17
Lines 40-41, change "laser-ablation" to --laser ablation--
Line 43, change "pre-made" to --premade--

Column 18
Line 9, change "oxyflouride" to --oxyfluoride--
Line 39, change "oxyflouride" to --oxyfluoride--

UNITED STATES PATENT AND TRADEMARK OFFICE
CERTIFICATE OF CORRECTION

PATENT NO.         : 7,427,201 B2
APPLICATION NO. : 11/330458
DATED                 : September 23, 2008
INVENTOR(S)      : Milton D. Meisner

It is certified that error appears in the above-identified patent and that said Letters Patent is hereby corrected as shown below:

Column 19
Claim 7, line 25, change "laser-ablation" to --laser ablation--

Column 20
Claim 12, line 11, change "electro-magnetic" to --electromagnetic--
Claim 15, line 37, change "laser-ablation" to --laser ablation--
Claim 17, line 46, change "oxyflouride" to --oxyfluoride--
Claim 18, line 54, change "defines" to --define--

Signed and Sealed this

Eighteenth Day of August, 2009

David J. Kappos
*Director of the United States Patent and Trademark Office*